(12) United States Patent
Zheng

(10) Patent No.: US 6,831,319 B2
(45) Date of Patent: Dec. 14, 2004

(54) CELL NITRIDE NUCLEATION ON INSULATIVE LAYERS AND REDUCED CORNER LEAKAGE OF CONTAINER CAPACITORS

(75) Inventor: Lingyi A. Zheng, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/225,913

(22) Filed: Aug. 22, 2002

(65) Prior Publication Data

US 2003/0020138 A1 Jan. 30, 2003

Related U.S. Application Data

(62) Division of application No. 09/912,041, filed on Jul. 24, 2001.

(51) Int. Cl.$^7$ ............................................. H01L 27/108
(52) U.S. Cl. ..................... 257/301; 257/303; 257/306; 257/534; 438/243; 438/386
(58) Field of Search ................................. 257/301, 303, 257/306, 534, 305, 310, 296, 298, 308, 307, 309; 438/243, 386; 361/303, 305, 309

(56) References Cited

U.S. PATENT DOCUMENTS

| | | | |
|---|---|---|---|
| 4,963,506 A | 10/1990 | Liaw et al. | 437/101 |
| 5,070,034 A | 12/1991 | Satoh et al. | 438/238 |
| 5,118,636 A | 6/1992 | Hosaka | |
| 5,445,999 A | 8/1995 | Thakur et al. | 437/242 |
| 5,663,087 A | 9/1997 | Yokozawa | 438/762 |
| 5,783,469 A | 7/1998 | Gardner et al. | |
| 5,882,978 A | 3/1999 | Srinivasan et al. | 438/396 |
| 5,939,333 A | 8/1999 | Hurley et al. | 438/241 |
| 5,981,404 A | 11/1999 | Sheng et al. | 438/791 |
| 6,077,754 A | 6/2000 | Srinivasan et al. | 438/396 |
| 6,147,013 A | 11/2000 | Sun et al. | 438/791 |

(List continued on next page.)

OTHER PUBLICATIONS

Stanley Wolf Ph.D. et al., "Silicon processing for the VLSI ERA," Chemical Vapor Deposition of Amorphous and polycrystalline films, p. 205.*
Wolf and Tauber, Silicon Processing for the VLSI Era, vol. 1: Process Technology, 2$^{nd}$ ed., Lattice Press, Sunset Beach, Cal., pp. 202–206 (2000).
Van Zant, Peter, Microchip Fabrication, A Practical Guide to Semiconductor Processing, 4th ed., McGraw–Hill, New York, pp. 337–357 and 363–366 (2000).
Wolf and Tauber, Silicon Processing for the VLSI Era, vol. 1: Process Technology, 2nd ed., Lattice Press, Sunset Beach, Cal., pp. 371–433 (2000).

Primary Examiner—Minhloan Tran
Assistant Examiner—Tan Tran
(74) Attorney, Agent, or Firm—Whyte Hirschboeck Dudek SC (57) ABSTRACT

Methods of forming a uniform cell nitride dielectric layer over varying substrate materials such as an insulation material and a conductive or semiconductive material, methods of forming capacitors having a uniform nitride dielectric layer deposited onto varying substrate materials such as an insulation layer and overlying conductive or semiconductive electrode, and capacitors formed from such methods are provided. In one embodiment of forming a uniform cell nitride layer in a capacitor construction, a surface-modifying agent is implanted into exposed surfaces of an insulation layer of a capacitor container by low angle implantation to alter the surface properties of the insulation layer for enhanced nucleation of the depositing cell nitride material, preferably while rotating the substrate for adequate implantation of the modifying substance along the top corner portion of the container. The resulting cell nitride layer has a uniform thickness over the insulation layer and the lower electrode, thus eliminating punch-through and corner leakage problems. The capacitors are particularly useful in fabricating DRAM cells.

75 Claims, 3 Drawing Sheets

U.S. PATENT DOCUMENTS

| | | | |
|---|---|---|---|
| 6,171,977 B1 | 1/2001 | Kasai et al. | 438/775 |
| 6,197,653 B1 | 3/2001 | Khamankar et al. | 438/398 |
| 6,204,142 B1 * | 3/2001 | Thakur | 438/396 |
| 6,211,033 B1 | 4/2001 | Sandhu et al. | 438/387 |
| 6,235,571 B1 | 5/2001 | Doan | 438/240 |
| 6,258,690 B1 | 7/2001 | Zenke | 438/296 |
| 6,268,299 B1 | 7/2001 | Jammy et al. | 438/791 |
| 6,284,583 B1 | 9/2001 | Saida et al. | 438/216 |
| 6,326,277 B1 | 12/2001 | DeBoer | |
| 6,465,373 B1 | 10/2002 | Zheng et al. | 438/794 |
| 6,518,117 B2 | 2/2003 | Ping et al. | 438/239 |
| 6,538,274 B2 | 3/2003 | Zheng et al. | 257/296 |
| 2001/0018787 A1 * | 9/2001 | Shin et al. | 29/25.01 |

* cited by examiner

CELL NITRIDE NUCLEATION ON INSULATIVE LAYERS AND REDUCED CORNER LEAKAGE OF CONTAINER CAPACITORS

FIELD OF THE INVENTION

The present invention relates generally to fabrication of integrated circuit devices and, more particularly, to methods for forming cell nitride layers and capacitors, and capacitor constructions.

BACKGROUND OF THE INVENTION

Nitride layers are frequently used in the fabrication of semiconductor wafers, for example, in the fabrication of MOSFET gates, memory cells, and capacitors. The nitride layers are utilized as an insulation layer over silicon surfaces to electrically isolate conductive components of a semiconductor circuit from one another. Nitride films are also used as a diffusion barrier to protect regions of a semiconductor wafer during local oxidation of silicon. In a capacitor, a dielectric nitride layer typically separates the upper and lower conductive plates or electrodes.

Various processes are used to produce a nitride layer. One method is by rapid thermal nitridation (RTN), which comprises annealing a silicon layer in an $NH_3$ or other nitrogen-containing gas that reacts with the silicon to produce silicon nitride. However, the growth of the nitride layer is extremely slow and self-limiting since the $NH_3$ or other nitrogen-containing gas is not capable of adequately diffusing through the growing silicon nitride layer to react with the underlying silicon. The ultimate thickness of a silicon nitride film produced by nitridation is typically only 3 to 4 nm at high temperatures. Such thickness is usually too low to adequately function as a barrier to prevent further oxidation of the silicon surface during subsequent processing, or as a capacitor dielectric layer between two conductive capacitor plates Surface properties of the wafer surface play an important role in the initial growth of cell nitride films in thin-film processes, which will impact the properties and structure of the thin film that is deposited. Different nucleation and deposition rates occur for the deposition of nitride on different wafer surfaces. This leads to different or degraded electrical characteristics of semiconductor devices having different wafer surfaces that are fabricated using a nitride deposited layer. In addition, deposition of nitride also includes an incubation time at the start of the deposition where there is no apparent deposition of nitride. The incubation time may extend up to several minutes for some surfaces. Surfaces exhibiting such different rates and incubation times include, for example, borophosphosilicate glass (BPSG), silicon, polysilicon, hemispherical grain (HSG) polysilicon, other doped silicon or polysilicon surfaces, other doped oxides, among others.

Figure 1A:
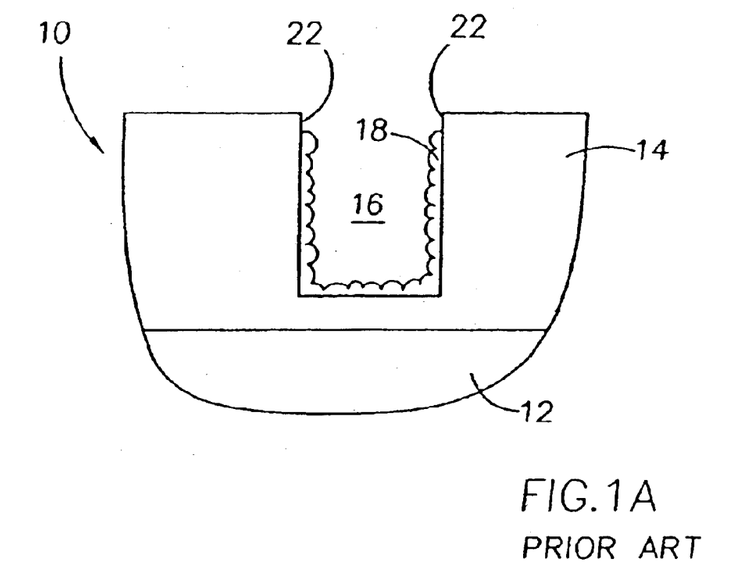
FIG. 1A is a diagrammatic cross-sectional view of a semiconductor wafer at a preliminary step of a processing sequence according to a prior art method of forming a container capacitor.
Figure 1B:
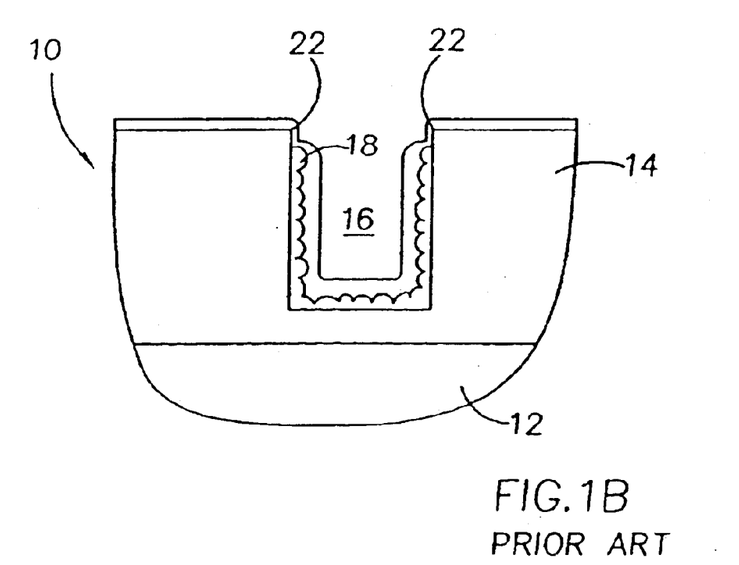
FIG. 1B is a view of the wafer fragment of FIG. 1A at subsequent and sequential processing steps, showing formation of a cell nitride layer according to a prior art process.

An example of a prior art process for forming a DRAM container capacitor is described with reference to FIGS. 1A–1B. Referring to FIG. 1A, an exemplary semiconductor wafer fragment 10, shown in a preliminary processing step, comprises a substrate 12, an insulative layer 14 of borophosphosilicate glass (BPGS) formed over the substrate, an opening 16 patterned and etched into the BPSG layer 14, and a hemispherical grain (HSG) polysilicon layer 18 formed over the BPSG insulative layer 14 as a bottom electrode or plate of a storage capacitor. As shown in FIG. 1B, a nitride dielectric layer 20 is deposited over the HSG silicon layer 18 and the exposed surfaces of the BPSG layer 14. The dielectric layer 20 will typically comprise silicon nitride ($Si_3N_4$) and/or silicon oxide ($SiO_2$), with $Si_3N_4$ being generally preferred due to its higher dielectric constant.

Problems have been encountered in connection with the thickness of the cell nitride layer due to the poor nucleation of cell nitride on BPSG and other insulating materials that form the walls of the container capacitor. Due to the poor nucleation, the cell nitride layer on the insulating (BPSG) layer 14 is substantially thinner than on the overlying electrode layer 18 which can comprise a conductive or semiconductive material such as HSG silicon, which is receptive to nitridation. The non-uniformity of the nitride film deposited on various surfaces is caused by the different surface energies of the different substrates. Consequently, in a subsequent cell nitride wet re-oxidation step, the thin nitride layer on the insulating (BPSG) material cannot prevent the electrode (HSG silicon) layer from oxidation, which causes problems with "punch through" of the nitride layer, which diminishes the function of the capacitor. Also as a result of the poor nitride nucleation on the insulating material (e.g., BPSG), a very thin nitride layer is formed at the top corner area 22 of the container where the electrode (e.g., HSG silicon) intersects with the container wall and the insulating (BPSG) material is exposed. This results in high leakage, i.e., "corner leakage," between the bottom electrode and the top cell plate. Thus, due to the poor nucleation of cell nitride on the insulating (BPSG) material, problems have been encountered with reducing the thickness of cell nitride layers to below 50 angstroms in the manufacture of container capacitors.

A method for forming a uniform nitride layer over different substrate materials is disclosed in U.S. Pat. No. 6,235,571 (Doan), which describes forming a uniform dielectric film layer over a bottom electrode comprising a nitridation receptive material and an insulating material comprising a nitridation resistive material in a storage capacitor fabrication. The method involves depositing a thin layer of non-doped silicon over the bottom electrode and insulating material, and then converting the silicon layer to a silicon nitride compound by thermal nitridation using a nitrogen-containing gas ($NH_3$). A silicon nitride layer is then deposited to a desired thickness. A disadvantage of this method is that it requires multiple steps to achieve a uniform nitride layer. The deposition of a very thin silicon nitride layer is very difficult to control.

Therefore, it would be desirable to develop a process of forming a cell nitride layer in a capacitor construction that overcomes such problems.

SUMMARY OF THE INVENTION

The present invention encompasses methods of forming a uniform cell nitride dielectric layer in a semiconductor fabrication, methods of incorporating such dielectric layers into capacitor constructions, and capacitors formed from such methods.

In one aspect, the invention provides methods of forming a uniform nitride dielectric film layer onto a substrate comprising a nitride resistive material such as BPSG or other insulating material, and a nitride receptive material such as HSG silicon or other semiconductive material or a conductive material (e.g., conductive metal). In one embodiment of the method, a surface-modifying agent is implanted into the exposed surfaces of the nitride resistive (BPSG) layer to modify the surface of the layer so as to enhance nitride nucleation in the subsequent formation of a nitride cell layer. Examples of suitable surface-modifying agents include ionizable nitrogen and silicon species. The subsequent deposition of nitride results in a substantially uniform thickness of the cell nitride layer over the nitride resistive (BPSG) portion and the nitride receptive (HSG silicon) portion of the substrate.

In another aspect, the invention encompasses methods of forming a capacitor. In one embodiment, the method comprises forming a first capacitor plate comprising a nitride receptive material such as a semiconductive material, for example, HSG polysilicon, in a container comprising an insulation or nitride resistive material such as BPSG; forming a cell nitride dielectric layer over the first capacitor plate; and forming a second capacitor plate over the cell nitride layer. The cell nitride layer is formed after implanting a surface-modifying agent such as an ionizable nitrogen or silicon species, by low angle implantation onto the exposed surfaces of the insulation or nitride resistive (BPSG) layer adjacent the capacitor container and at the top portion and corners of the container. Preferably, the substrate (e.g., wafer) is rotated during implantation to ensure uniform implantation of the surface-modifying agent into the insulation layer about the circumference of the top portion of the container, including the corners. The modifying agent alters the surface of the insulation layer to enhance nitride nucleation on the insulation layer in the subsequent formation of a nitride cell layer, and achieve a nitride cell layer that has a substantially uniform thickness over the surfaces of the lower electrode and the exposed surfaces of the insulation layer including over the corners of the container.

In another aspect, the invention provides a container capacitor. The capacitor comprises a container formed in a layer of a nitride resistive material such as BPSG or other like insulating material, a lower capacitor electrode comprising a nitride receptive material such as a semiconductive material such as HSG silicon, an upper capacitor electrode, and a nitride dielectric layer formed intermediate the upper and lower electrodes. In an embodiment of a capacitor according to the invention, the exposed surfaces of the insulation layer comprises an implanted species of ionizable nitrogen, silicon or other suitable surface-modifying agent with the overlying cell nitride layer deposited thereon. The capacitor can be incorporated into a semiconductor circuit, including a DRAM cell.

In another aspect, the invention provides an integrated circuit comprising a memory cell array and internal circuitry, and a capacitor fabricated according to the invention that is in electrical contact with an active area within the substrate of the memory cell array.

Semiconductor devices fabricated according to the present invention with a cell nitride insulating layer formed by implanting a surface-modifying agent into the insulation layer (e.g., BPSG) including the top corner portion of an insulative container, and then depositing a cell nitride layer over the lower electrode (e.g., HSG silicon) and exposed surfaces of the insulation layer, have substantially the same electrical performance as conventional devices and improved Cp-leakage performance over a device made with a cell nitride layer alone without the use of a surface-modifying agent as described herein. Also, with the implantation of a surface-modifying agent into the insulation material, the subsequent nucleation and deposition rate of the nitride material upon the different silicon materials (e.g., HSG polysilicon, BPSG) is substantially equivalent regardless of the material. This alleviates the problem of different or degraded electrical characteristics that result from the differences in the nitride thickness deposited on adjacent surfaces, and particularly the corners of a capacitor container that may comprise BPSG. Such differences are especially apparent, for example, between a conductor composed of HSG polysilicon and an insulator composed of BPSG, where a relatively thin nitride layer deposited at an HSG polysilicon/BPSG edge (e.g., container corner) can result in degraded electrical properties at that edge and for the resulting fabricated device.

The use of the present process of depositing a cell nitride layer also resolves the fatal bubbling and punch-through problems that occur with nitride layers that are deposited directly on insulative substrates in semiconductor devices. In addition, implantation is a well-known technology that is scalable and works well in connection with the trend toward shrinkage of capacitor containers and other semiconductor structures. The invention also allows cell nitride thickness to be scaled down below 50 angstroms and function to prevent "punch through" problems. The thick nitride layer that is deposited by the method of the invention at the top portion of the insulative (BPSG) container at its confluence with the lower (HSG silicon) electrode can avoid problems of top and bottom electrode shorts or high leakage which will increase the reliability of the device.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

DETAILED DESCRIPTION OF THE PREFERRED EMBODIMENTS

The invention will be described generally with reference to the drawings for the purpose of illustrating the present preferred embodiments only and not for purposes of limiting the same. The figures illustrate processing steps for use in the fabrication of semiconductor devices in accordance with the present invention. It should be readily apparent that the processing steps are only a portion of the entire fabrication process.

In the current application, the terms "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive wafer fragments or wafers described above. The term "nitride receptive" material refers to materials that are receptive to nitride nucleation having a relatively shorter nitride nucleation incubation time, such as a conductive metal or other conducting material or silicon HSG silicon or other semiconductive material. The term "nitride resistive" material refers to materials that are unreceptive to nitride nucleation, such as BPSG, oxides, and other materials.

In DRAM (Dynamic Random Access Memory), the capacitors used to store information are generally called "cell capacitors" because they are the unit cells of the memory array. The silicon nitride dielectrics for the cell capacitor is hence generally called "cell nitrides." In the current application, the term "cell nitride" is used for convenience but it is understood to be exchangeable with the term "silicon nitride" in a broader meaning.

An embodiment of a method of the present invention is described with reference to FIGS. 2A–2E, in a method of forming a cell nitride layer in the construction of a container capacitor. While the concepts of the invention are conducive to the fabrication of container capacitors, the concepts described herein can be applied to other semiconductor devices that would likewise benefit from the use of a thin dielectric film that will substantially reduce oxidation punch through. Therefore, the depiction of the invention in reference to the manufacture of a container capacitor is not meant to limit the extent to which one skilled in the art might apply the concepts taught herein.

Figure 2A:
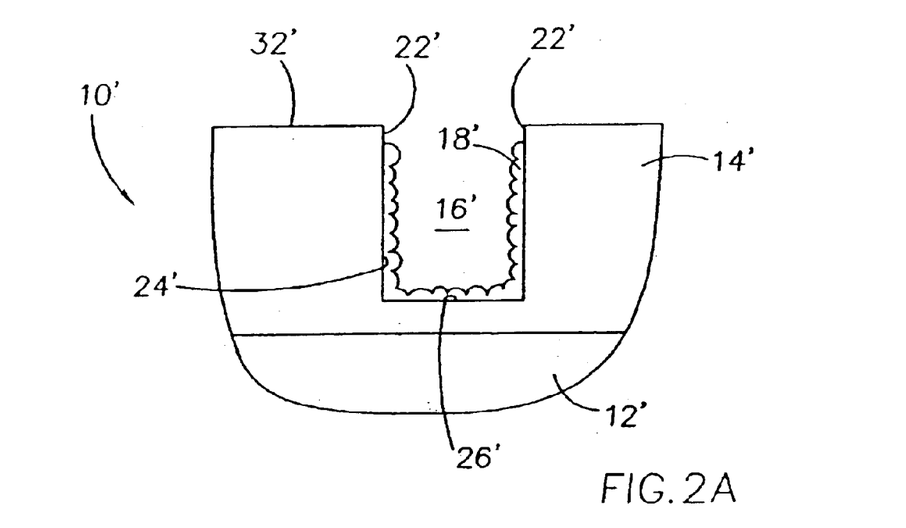
FIG. 2A is a diagrammatic cross-sectional view of a semiconductor wafer at a preliminary step of a processing sequence.

Referring to FIG. 2A, a semiconductor wafer fragment 10' is shown at a preliminary processing step of the method of the invention, and is identical to prior art wafer fragment 10. The wafer fragment 10' in progress can comprise a semiconductor wafer substrate or the wafer along with various process layers formed thereon, including one or more semiconductor layers or other formations, and active or operable portions of semiconductor devices The wafer fragment 10' is shown as comprising a substrate 12' and an overlying insulation layer 14' (i.e., nitride resistive material). Exemplary insulation materials include silicon dioxide ($SiO_2$), phosphosilicate glass (PSG), borosilicate glass (BSG), and borophosphosilicate glass (BPSG), in a single layer or multiple layers, with the insulation layer 14", being BPSG in the illustrated example. A container or opening 16' with sidewalls 24' and a bottom portion 26', has been conventionally etched into the BPSG insulation layer 14'. The lower electrode 18' (i.e., nitride receptive material) of the capacitor comprises a semiconductive material, being HSG polysilicon in the illustrated example. An HSG silicon electrode can be formed, for example, by converting an amorphous silicon layer deposited on the BPSG insulation layer 14' to a hemispherical grain (HSG) silicon layer. The foregoing features can be formed by conventional fabrication methods known and used in the art. As shown, the upper edge of the HSG silicon electrode 18' is slightly lower than the top corner area 22' of the container 16' following a chemical mechanical planarization (CMP) step, thus exposing a portion of the BPSG layer along the container sidewall 24' and corner 22'.

A cell dielectric layer 20' is formed on the BPSG insulation layer 14' and the HSG silicon conductive lower electrode 18'. As noted above, insulating materials such as BPSG, are not readily receptive to nitride nucleation compared to conductive materials such as conductive metals and semiconductive materials such as HSG silicon. However, in forming a container capacitor, it is important to provide a cell dielectric layer that has a substantially uniform thickness over both the HSG silicon surface and the insulative BPSG container surface including at the corners 22' of the container to avoid problems such as punch-through and structure failure.

Figure 2B:
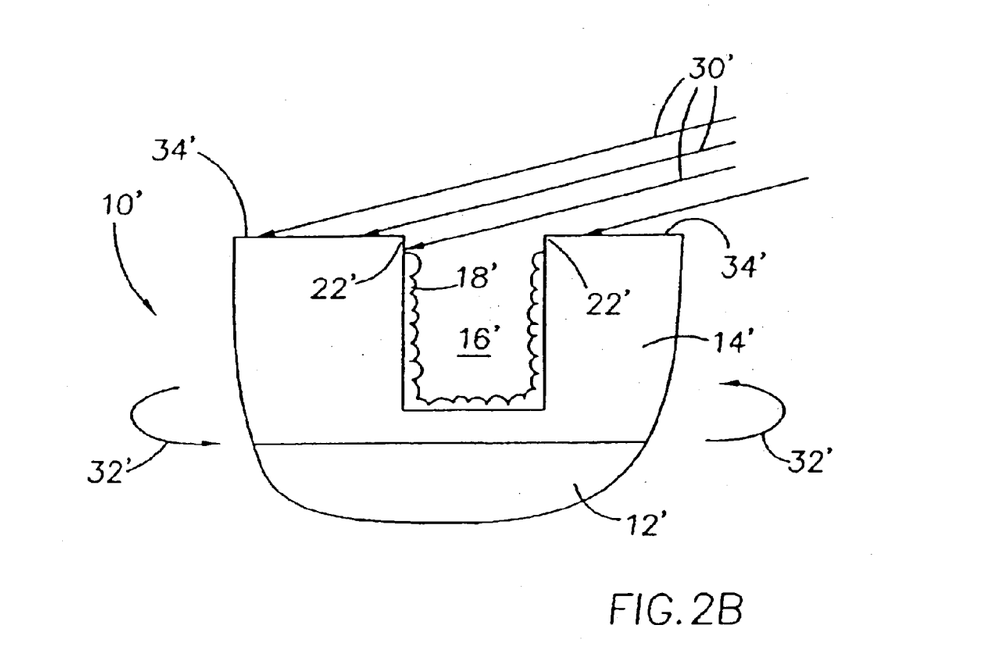
FIGS. 2B–2E are views of the wafer fragment of FIG. 2A at subsequent and sequential processing steps, showing fabrication of a capacitor electrode according to an embodiment of a method of the invention.
Figure 2C:
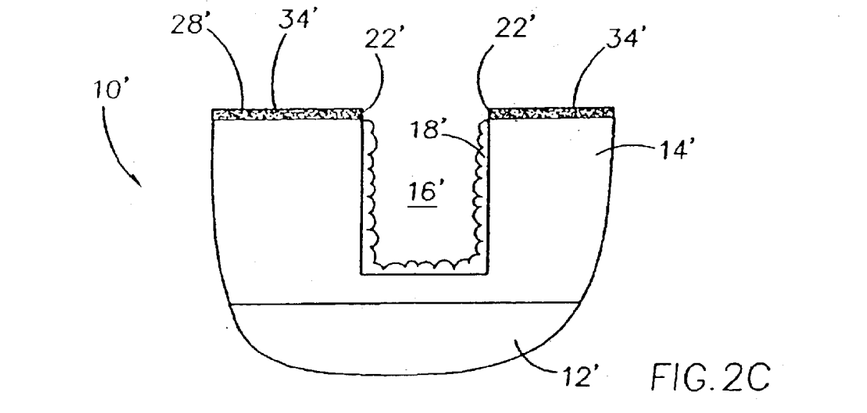

To achieve this according to an embodiment of the method of the invention, a surface-activating material (agent) 28' is implanted into exposed surfaces of the BPSG insulation layer 14" adjacent to the container 16' and at the top corner area 22' of the container, as shown in FIG. 2B, resulting in the structure shown in FIG. 2C. The implantation of the surface-activating agent 28' functions to modify the surface characteristics (i.e., physical and chemical properties) of the BPSG material 14' to enhance nucleation of nitride onto the BPSG layer in a subsequent deposition of cell nitride dielectric material as a layer. A suitable surface-activating agent will reduce the incubation time of the nitride during the film deposition step. Suitable surface-activating agents to improve nitride nucleation on the insulation layer 14' include ionizable species of nitrogen, silicon, or other like species. Exemplary surface-activating agents include a nitrogen-containing gas such as trifluoronitride ($NF_3$), nitrogen ($N_2$), ammonia ($NH_3$), nitrous oxide ($N_2O$), nitric oxide (NO), and the like; and a silicon source such as silicon tetrafluoride ($SiF_4$), silane ($SiH_4$), dichlorosilane ($SiH_2Cl_2$), trichlorosilane ($SiCl_3$), silicon tetrachloride ($SiCl_4$), and the like.

The implantation is generally performed by ion implantation at a low angle of implantation but generally in the range of about 60° to about 85° from vertical, depending on the geometry of the container. The arrows 30' show the low angle implantation at an angle of about 75° from vertical. Due to the container structure, implantation is generally limited to the surface 34' of the BPSG layer adjacent to the container 16' and at the top portion of the container in the proximity of the corners 22'. During the implantation process, it is preferred that the wafer 10' is rotated (arrows 32') to ensure adequate implantation of the surface-activating agent 28' into the BPSG layer 14' along the circumference of the top portion of the container 16' to cover substantially the entire corner area 22'. The arrows 30' show the angle of implantation of the surface-activating agent 28' to limit the implantation to the corner area 22' of the capacitor container and the exposed surface 34' of the BPSG layer 14' so as not to cause damage to the lower electrode 18'. By adjusting the implantation angle and rotating the wafer, a uniform and N-rich (or other species) implantation layer can be generated on the BPSG surface and the container corner section.

A conventional ion implantation process can be used to implant the surface-activating agent 28'. In general, wafers are loaded in one end of an ion implanter (ionization chamber) and the surface-activating agent source (typically in gas form) in the other end of the chamber. The ions implanted are ionized atoms of the surface-activating agent. The chamber is maintained at a low pressure (vacuum) of about $10^{-3}$ torr. At the source end, the atoms are ionized (given an electrical charge), accelerated to a high speed, and swept across and into the surface 34' of the BPSG layer 14'. The concentration of atoms (i.e., the dose) of the surface-activating agent 28' that are implanted in the BPSG layer is preferably about $10^{12}$ to about $10^{22}$ atoms/cm$^3$, preferably about $10^{15}$ to about $10^{19}$ atoms/cm$^3$.

Figure 2D:
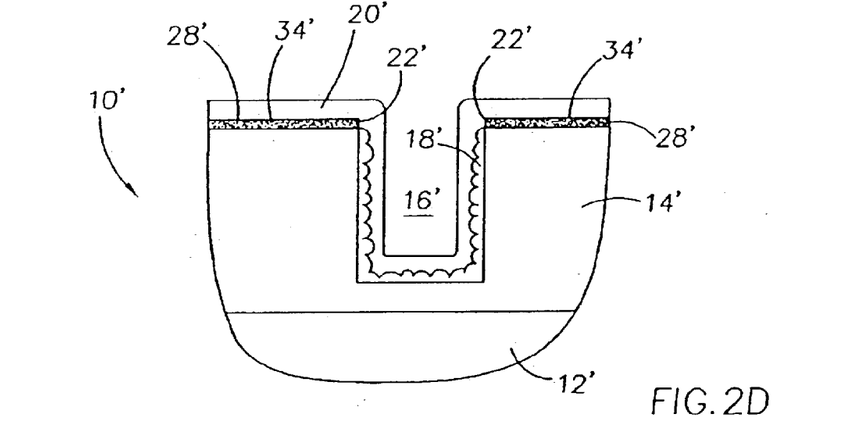

Referring now to FIG. 2D, a nitride dielectric layer 20' is deposited to a desired thickness over the HSG electrode 18' and exposed surfaces 34' of the BPSG layer 14' including the top corners area 22' of the container. Preferably, the nitride layer 20' is about 100 angstroms or less, preferably about 60 angstroms or less. The deposited nitride layer 20' advantageously has a substantially uniform thickness overlying the BPSG layer 14' and the HSG silicon lower electrode 18'.

A conventional low pressure chemical vapor deposition (LPCVD) process can be used for conformally depositing the cell nitride layer 20', typically by CVD. For example, a film of silicon nitride can be deposited by low pressure chemical vapor deposition (LPCVD) by reacting dichlorosilane ($SiH_2Cl_2$, DCS) and ammonia ($NH_3$) over the wafer surface in a hot-wall reactor at about 600 to about 800° C., a pressure in the range of about 50 mTorr to about 1500 mTorr, and an $NH_3$:DCS ratio in the range of about 3:1 to about 10:1, preferably about 4:1 to about 6:1. In another example, a conventional LPCVD process can likewise be used for depositing a nitride layer 24' by reacting silicon tetrachloride ($SiCl_4$) and ammonia ($NH_3$) at a temperature of about 500° C. to about 800° C., a pressure in the range of about 50 mTorr to about 1500 mTorr, with a $NH_3$:$SiCl_4$ ratio in the range of about 10:1 to about 1:2, preferably about 2:1 to about 1:2. The cell nitride layer can also be made by presenting a silicon source gas such as $SiH_4$, $Si_2H_6$, and $SiH_2Cl_2$, among others, and a nitrogen source gas such as $N_2$ and $NH_3$ to the deposition chamber using deposition conditions suitable for nitride deposition. Conventional silicon nitride deposition processes other than LPCVD can also be used to deposit the cell nitride layer, including physical deposition, plasma enhanced chemical vapor deposition, and rapid thermal chemical vapor deposition, among others.

The wafer 10' is then subjected to a wet gate reoxidation according to conventional techniques (not shown). The wet oxidation step reduces defects in the cell nitride layer 20' to reduce leakage significantly.

With a consistent, uniform thickness, preferably less than 50 angstroms, the cell nitride dielectric layer 20' has a thickness that is sufficient to prevent oxidation punch-through from the wet oxidation step. Oxidation punch-through refers to the diffusion of atomic oxygen completely through a dielectric film. The oxidation punch-through will cause the HSG silicon electrode to become oxidized, which will diminish the capacitor function. The oxidation punch-through can also adversely affect transistor operation. The electrical field at the edge of the HSG silicon electrode is higher than at other areas. The increased thickness of the cell nitride layer 20' at the corners 22' of the container helps to reduce the corner leakage where the BPSG and HSG silicon materials converge.

Figure 2E:
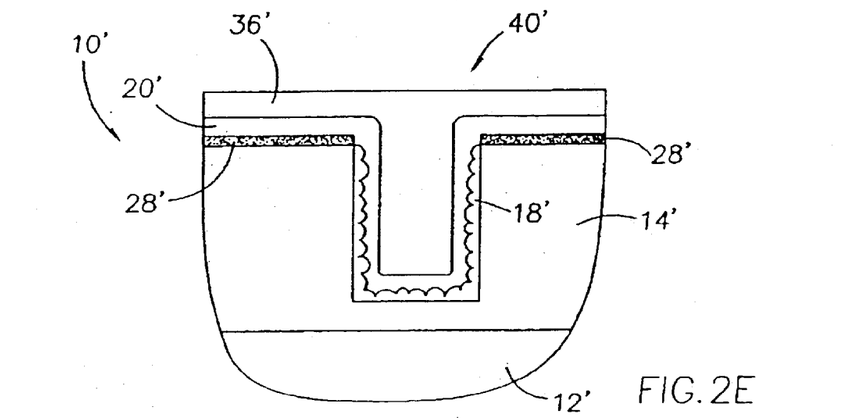

Referring now FIG. 2E, a conductive material is then deposited over the dielectric layer 20' to form the top capacitor plate electrode 36'. The top electrode 36' comprises a conductive material such as doped polysilicon or a conductive metal. The conductive material can be deposited on the dielectric layer 20' by conventional methods, such as CVD, or physical vapor deposition (e.g., sputtering) for a metal plate, to complete the capacitor structure 40'.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A capacitor, comprising:
   a container disposed in an nitride resistive material layer having a surface, the container comprising side walls and a top corner portion, a lower capacitor electrode layer overlying the nitride resistive material layer within the container, and a portion of the nitride resistive material layer at the top corner portion of the container comprising an implant of a surface-modifying agent;
   a dielectric layer overlying the lower capacitor electrode layer and the nitride resistive material layer; and
   an upper capacitor plate overlying the dielectric layer;
   wherein the implant of the surface-modifying agent is effective to modify the surface of the nitride resistive material layer such that the dielectric layer has a substantially uniform thickness over both the nitride resistive material layer and the lower capacitor electrode layer.

2. The capacitor of claim 1, wherein the implant of the surface-modifying agent comprises atoms of a nitrogen-containing gas selected from the group consisting of trifluoronitride, nitrogen, ammonia, nitrous oxide, and nitric oxide.

3. The capacitor of claim 1, wherein the implant of the surface-modifying agent comprises atoms of trifluoronitride.

4. The capacitor of claim 1, wherein the implant of the surface-modifying agent comprises atoms of a silicon-containing gas selected from the group consisting of silicon tetrafluoride, silane, dichlorosilane, trichlorosilane, and silicon tetrachloride.

5. The capacitor of claim 1, wherein the implant of the surface-modifying agent comprises atoms of silicon tetrafluoride.

6. The capacitor of claim 1, wherein the nitride resistive material layer comprises an insulative material, and the lower electrode comprises a semiconductive material.

7. The capacitor of claim 1, wherein the nitride resistive material layer comprises an insulative material and the lower electrode comprises a conductive material.

8. The capacitor of claim 1, wherein the capacitor is integrated into a DRAM cell.

9. A capacitor, comprising:
   a container disposed in a nitride resistive material layer, the container comprising side walls and a top corner portion, and a lower capacitor electrode within the container and overlying the nitride resistive layer, a portion of the nitride resistive material layer at the top corner portion of the container comprising an implant of a surface-modifying agent comprising atoms of a nitrogen gas;
   a dielectric layer overlying the lower capacitor electrode and the nitride resistive material layer, whereby the implant of the surface-modifying agent is effective such that the dielectric layer has a substantially uniform thickness over the lower capacitor electrode and the nitride resistive material layer; and
   an upper capacitor plate overlying the dielectric layer.

10. The capacitor of claim 9, wherein the implant of the surface-modifying agent comprises atoms of a nitrogen-containing gas selected from the group consisting of trifluoronitride, nitrogen, ammonia, nitrous oxide, and nitric oxide.

11. The capacitor of claim 9, wherein the nitride resistive material layer comprises about 1012 to about 1022 atoms/$cm^3$ of the surface-modifying agent.

12. The capacitor of claim 9, wherein the nitride resistive material comprises an insulative material and the lower electrode comprises a semiconductive material.

13. The capacitor of claim 9, wherein the nitride resistive material comprises an insulative material and the lower electrode comprises a conductive material.

14. A capacitor, comprising:
a container disposed in a nitride resistive material layer, the container comprising side walls and a top corner portion, and a lower capacitor electrode within the container and overlying the nitride resistive material layer, a portion of the nitride resistive material layer at the top corner portion of the container comprising an implant of a surface-modifying agent comprising atoms of a silicon gas;
a dielectric layer overlying the lower capacitor electrode and the insulation layer; whereby the implant of the surface-modifying agent is effective such that the dielectric layer has a substantially uniform thickness over the lower capacitor electrode and the nitride resistive material layer; and
an upper capacitor plate overlying the dielectric layer.

15. The capacitor of claim 14, wherein the implant of the surface-modifying agent comprises atoms of a silicon-containing gas selected from the group consisting of silicon tetrafluoride, silane, dichlorosilane, trichlorosilane, and silicon tetrachloride.

16. The capacitor of claim 14, wherein the nitride resistive material layer comprises about 1012 to about 1022 atoms/cm$^3$ of the surface-modifying agent.

17. The capacitor of claim 14, wherein the nitride resistive material layer comprises an insulative material and the lower electrode comprises a conductive material.

18. The capacitor of claim 14, wherein the nitride resistive material layer comprises an insulative material and the lower electrode comprises a semiconductive material.

19. A semiconductor circuit, comprising a capacitor;
the capacitor comprising a dielectric nitride layer interposed between a lower electrode and an upper electrode, the lower electrode disposed in a container within a nitride resistive material layer, the container comprising side walls and a top corner portion, the dielectric nitride layer disposed over the lower electrode and a portion of the nitride resistive material layer at the top corner portion of the container, the nitride resistive material layer comprising an implant of a surface-modifying agent effective for modifying the surface of the nitride resistive material layer such that the dielectric nitride layer has a uniform thickness over the lower capacitor electrode and the nitride resistive material layer.

20. The semiconductor circuit of claim 19, wherein the implant of the surface-modifying agent comprises atoms of a nitrogen-containing gas selected from the group consisting of trifluoronitride, nitrogen, ammonia, nitrous oxide, and nitric oxide.

21. The semiconductor circuit of claim 19, wherein the implant of the surface-modifying agent comprises atoms of a silicon-containing gas selected from the group consisting of silicon terafluoride, silane, dichlorosilane, trichlorosilane, and silicon tetrachloride.

22. The semiconductor circuit of claim 19, wherein the nitride resistive material comprises about 1012 to 1022 atoms/cm$^3$ of the surface-modifying agent.

23. The semiconductor circuit of claim 19, wherein the nitride resistive material layer comprises an insulative material, and lower electrode comprises a semiconductive material.

24. The semiconductor circuit of claim 19, wherein the nitride resistive material layer comprises an insulative material, and the lower electrode comprises a conductive material.

25. A semiconductor circuit, comprising a capacitor;
the capacitor comprising a nitride dielectric layer interposed between a lower electrode and an upper electrode, the lower electrode disposed in a container within an insulation layer, the container comprising side walls and a top corner portion, the insulation layer at the top corner portion of the container comprising an implant of a surface-modifying agent comprising atoms of a nitrogen gas effective for modifying the surface of the insulation layer such that the nitride dielectric layer has a uniform thickness over the lower capacitor electrode and the insulation layer.

26. The semiconductor circuit of claim 25, wherein the implant of the surface-modifying agent comprises atoms of a nitrogen gas selected from the group consisting of trifluoronitride, nitrogen, ammonia, nitrous oxide, and nitric oxide.

27. A semiconductor circuit, comprising a capacitor;
the capacitor comprising a nitride dielectric layer interposed between a lower electrode and an upper electrode, the lower electrode disposed in a container within an insulation layer, the container comprising side walls and a top corner portion, the insulation layer at the top corner portion of the container comprising an implant of a surface-modifying agent comprising atoms of a silicon gas effective for modifying the surface of the insulation layer such that the nitride dielectric layer has a uniform thickness over the lower capacitor electrode and the insulation layer.

28. The semiconductor circuit of claim 27, wherein the surface-modifying agent comprises atoms of a silicon gas selected from the group consisting of silicon tetrachloride, silane, dichlorosilane, trichlorosilane, and silicon tetrachloride.

29. An integrated circuit, comprising:
an array of memory cells;
internal circuitry; and
at least one capacitor formed in a container in a nitride resistive material layer and in electrical contact with an active area within a semiconductive substrate of the memory cell array, the capacitor comprising a nitride dielectric layer interposed between a lower electrode and an upper electrode, the lower electrode disposed in the container, the container comprising side walls and a top corner portion, the nitride resistive material layer at the top corner portion of the container comprising an implant of a surface-modifying agent effective for modifying the surface of the insulation layer such that the nitride dielectric layer has a uniform thickness over the lower capacitor electrode and the nitride resistive material layer.

30. The integrated circuit of claim 29, wherein the implant of the surface-modifying agent comprises a material derived from a nitrogen-containing gas selected from the group consisting of trifluoronitride, nitrogen, ammonia, nitrous oxide, and nitric oxide.

31. The integrated circuit of claim 29, wherein the implant of the surface-modifying agent comprises a material derived from a silicon-containing gas selected from the group consisting of silicon tetrafluoride, silane, dichlorosilane, trichlorosilane, and silicon tetrachloride.

32. The integrated circuit of claim 29, wherein the nitride resistive material layer comprises an insulative material, and the lower electrode comprises a semiconductive material.

33. The integrated circuit of claim 29, wherein the nitride resistive material layer comprises an insulative material, and the lower electrode comprises a conductive material.

34. A capacitor, comprising:

a container disposed in a nitride resistive material layer, the container comprising side walls and a top portion, and a lower capacitor electrode overlying the nitride resistive material layer within the container, the nitride resistive material layer adjacent the top portion of the container comprising an implant of a surface-modifying agent;

a dielectric layer having a substantially uniform thickness overlying the lower capacitor electrode and the nitride resistive material layer; and an upper capacitor plate overlying the dielectric layer.

35. A capacitor, comprising:

a container disposed in a nitride resistive material layer, the container comprising side walls and a top portion, and a lower capacitor electrode overlying the nitride resistive material layer within the container; the nitride resistive material layer adjacent the top portion of the container comprising an implant of a surface-modifying agent comprising atoms of a nitrogen gas;

a dielectric layer having a substantially uniform thickness overlying the lower capacitor electrode and the nitride resistive material layer; and an upper capacitor plate overlying the dielectric layer.

36. A capacitor, comprising:

a container disposed in a nitride resistive material layer, the container comprising side walls and a top portion, and a lower capacitor electrode overlying the nitride resistive material layer within the container, the nitride resistive material layer adjacent the top portion of the container comprising an implant of a surface-modifying agent comprising atoms of a silicon gas;

a dielectric layer having a substantially uniform thickness overlying the lower capacitor electrode and the insulation layer; and an upper capacitor plate overlying the dielectric layer.

37. A semiconductor circuit, comprising a capacitor:

the capacitor comprising a dielectric nitride layer interposed between a lower electrode and an upper electrode, the lower electrode disposed within a container disposed within a nitride resistive material layer, the container comprising side walls and a top portion, and the lower electrode overlying the nitride resistive material layer within the container, the nitride resistive material layer adjacent the top portion of the container comprising an implant of a surface-modifying agent, wherein the dielectric nitride layer has a substantially uniform thickness over the lower capacitor electrode and the nitride resistive material layer.

38. A semiconductor circuit, comprising a capacitor:

the capacitor comprising a lower electrode disposed within a container within a nitride resistive material layer, the container comprising side walls and a top portion, the lower electrode overlying the nitride resistive material layer within the container, the nitride resistive material layer about a circumference at the top portion of the container composing an implant of a surface-modifying agent, wherein an overlying dielectric layer is substantially uniform over the lower capacitor electrode and the nitride resistive material layer.

39. A semiconductor circuit, comprising a capacitor:

the capacitor comprising a nitride dielectric layer interposed between a lower electrode and an upper electrode, the lower electrode disposed in a container in an insulation layer, the container comprising side walls and a top portion, the insulation layer adjacent the top portion of the container comprising an implant of a surface-modifying agent comprising atoms of a nitrogen gas, wherein the nitride dielectric layer has a substantially uniform thickness over the lower capacitor electrode and the insulation layer.

40. A semiconductor circuit, comprising a capacitor:

the capacitor comprising a nitride dielectric layer interposed between a lower electrode and an upper electrode, the lower electrode disposed in a container in an insulation layer, the container comprising side walls and a top portion, the insulation layer adjacent the top portion of the container comprising an implant of a surface-modifying agent comprising atoms of a silicon gas, wherein the nitride dielectric layer has a substantially uniform thickness over the lower capacitor electrode and the insulation layer.

41. An integrated circuit, comprising:

an array of memory cells;

internal circuitry; and at least one capacitor in electrical contact with an active area within a semiconductive substrate of the memory cell array, the capacitor comprising a dielectric nitride layer interposed between a lower electrode and an upper electrode; the lower electrode disposed within a container disposed within a nitride resistive material layer, the container comprising side walls and a top portion, the lower electrode overlying the nitride resistive material layer within the container, the nitride resistive material layer adjacent the top portion of the container comprising an implant of a surface-modifying agent, wherein the dielectric layer has a substantially uniform thickness over the lower capacitor electrode and the nitride resistive material layer.

42. An integrated circuit, comprising:

an array of memory cells;

internal circuitry; and at least one capacitor in electrical contact with an active area within a semiconductive substrate of the memory cell array, the capacitor comprising a lower electrode disposed within a container within a nitride resistive material layer, the container comprising side walls and a top portion, the lower electrode overlying the nitride resistive material layer within the container, the nitride resistive material layer about a circumference at the top portion of the container comprising an implant of a surface-modifying agent, wherein an overlying dielectric layer is substantially uniform over the lower capacitor electrode and the nitride resistive material layer.

43. An integrated circuit, comprising:

an array of memory cells;

internal circuitry; and at least one capacitor in electrical contact with an active area within a semiconductive substrate of the memory cell array, the capacitor comprising a nitride dielectric layer interposed between a lower electrode and an upper electrode, the lower electrode disposed in a container in an insulation layer, the container comprising side walls and a top portion; the insulation layer adjacent the top portion of the container comprising an implant of a surface-modifying agent comprising atoms of a nitrogen gas, wherein the nitride dielectric layer has a substantially uniform thickness over the lower capacitor electrode and the insulation layer.

44. An integrated circuit, comprising:

an array of memory cells;

internal circuitry; and at least one capacitor in electrical contact with an active area within a semiconductive substrate of the memory cell array, the capacitor comprising a nitride dielectric layer interposed between a lower electrode and an upper electrode, the lower electrode disposed in a container in an insulation layer, the container comprising side walls and a top portion; the insulation layer adjacent the top portion of the container comprising an implant of a surface-modifying agent comprising atoms of a silicon gas, wherein the nitride dielectric layer has a substantially uniform thickness over the lower capacitor electrode and the insulation layer.

45. A semiconductor device, comprising:

a container disposed iii a nitride resistive material layer, the container having side walls and a top portion; and a conductive layer disposed over the side walls of the container;

the nitride resistive material layer at the top portion of the container comprising an implant of a surface-modifying agent.

46. A semiconductor device, comprising:

a container disposed in a nitride resistive material layer, the container having side walls and a top portion;

a conductive layer disposed over the side walls of the container; and a dielectric layer overlying the conductive layer and the nitride resistive material layer;

the nitride resistive material layer at the top portion of the container comprising en implant of a surface-modifying agent.

47. A semiconductor device, comprising:

a container disposed in a nitride resistive material layer, the container having side walls and a top portion;

a conductive layer disposed over the side walls of the container;

a dielectric layer overlying the conductive layer and the nitride resistive material layer; and a conductive layer overlying the dielectric layer;

the nitride resistive material layer at the top portion of the container comprising an implant of a surface-modifying agent.

48. A semiconductor device, comprising:

a substrate;

an opening disposed in a nitride resistive material layer over the substrate;

a conductive layer disposed within the opening; and an implant of a surface-modifying agent disposed within the nitride resistive material layer adjacent the opening.

49. A semiconductor device, comprising:

a substrate;

an opening disposed in a nitride resistive material layer over the substrate;

a conductive layer disposed within the opening;

an implant of a surface-modifying agent disposed within the nitride resistive material layer adjacent the opening; and a nitride dielectric layer disposed over the nitride resistive material layer and the conductive layer, whereby the dielectric layer has a substantially uniform thickness over the nitride resistive material layer and the conductive layer.

50. A semiconductor device, comprising:

a substrate;

an opening disposed in a nitride resistive material layer over the substrate;

a conductive layer disposed within the opening;

an implant of a surface-modifying agent disposed within in the nitride resistive material layer adjacent the opening;

a nitride dielectric layer disposed over the nitride resistive material layer end the conductive layer, whereby the dielectric layer has a substantially uniform thickness over the nitride resistive material layer and the conductive layer; and a conductive layer disposed over the nitride dielectric layer.

51. An integrated circuit supported by a substrate and comprising a capacitor; the capacitor comprising:

a container disposed in a nitride resistive material layer, the container having side walls and a top portion; and an electrode layer disposed over the side walls of the container;

the nitride resistive material layer at the top portion of the container comprising an an implant of a surface-modifying agent.

52. An integrated circuit supported by a substrate and comprising a capacitor; the capacitor comprising:

a container disposed in a nitride resistive material layer, the container having side walls and a top portion; and a lower capacitor electrode disposed over the nitride resistive material layer within the container;

the nitride resistive material layer adjacent the top portion of the container comprising an an implant of a surface-modifying agent.

53. A capacitor, comprising:

a container disposed in a nitride resistive material layer, the container having side walls and a top portion; and a conductive layer disposed over the side walls of the container;

the nitride resistive material layer at the top portion of the container comprising an an implant of a surface-modifying agent.

54. An integrated circuit supported by a substrate, and comprising a capacitor according to claim 53.

55. A semiconductor device, comprising:

an opening disposed in an nitride resistive material layer having a surface, the opening having sidewalls and a top corner portion;

a nitride receptive material layer disposed over the sidewalls of the opening;

an implant comprising a surface-modifying agent extending from the surface into the nitride resistive material layer including the top corner portion of the opening, such that a dielectric layer disposed over the nitride receptive material layer and the nitride resistive material layer has a substantially uniform thickness.

56. A semiconductor device, comprising:

an opening disposed in an insulating layer having a surface, the opening having sidewalls and a top corner portion;

a semiconductive material layer disposed over the sidewalls of the opening;

an implant comprising a surface-modifying agent extending from the surface into the insulating layer including the top corner portion of the opening, such that a dielectric layer disposed over the semiconductive material layer and the insulating layer has a substantially uniform thickness.

57. A semiconductor device, comprising:

an opening disposed in an insulating layer having a surface, the opening having sidewalls and a top corner portion;

a conductive material layer disposed over the sidewalls of the opening;

an implant comprising a surface-modifying agent extending from the surface into the insulating layer including the top corner portion of the opening, such that a dielectric layer disposed over the conductive material layer and the insulating layer has a substantially uniform thickness.

58. A semiconductor device, comprising:

an opening disposed in an nitride resistive material layer having a surface, the opening having sidewalls and a top corner portion;

a nitride receptive material layer disposed over the sidewalls of the opening;

an implant comprising a surface-modifying agent extending downwardly relative to the surface of the nitride resistive material layer including the top corner portion of the opening, such that a dielectric layer disposed over the nitride receptive material layer and the nitride resistive material layer has a substantially uniform thickness.

59. A semiconductor device, comprising:

a container disposed in an nitride resistive material layer having a surface, the container having sidewalls and a top corner area;

a nitride receptive material layer disposed over the sidewalls of the container;

an implant comprising a surface-modifying agent disposed within the nitride resistive material layer at the top corner area of the container, such that a dielectric layer disposed over the nitride receptive material layer and the nitride resistive material layer has a substantially uniform thickness over both of said layers.

60. A semiconductor device, comprising:

a container disposed in an nitride resistive material layer having a surface, the container having sidewalls and a top corner area;

a nitride receptive material layer disposed over the sidewalls of the container;

an implant comprising a surface-modifying agent extending into the nitride resistive material layer relative to the surface such that a dielectric layer disposed over the nitride receptive material layer and the nitride resistive material layer has a substantially uniform thickness over both of said layers.

61. A semiconductor device, comprising:

a container disposed in an nitride resistive material layer having a surface, the container having sidewalls and a top corner;

a nitride receptive material layer disposed over the sidewalls of the container;

an implant comprising a surface-modifying agent disposed within the nitride resistive material layer about a circumference from the top corner of the container such that a dielectric layer disposed over the nitride resistive material layer and the nitride receptive material layer has a substantially uniform thickness over both of said layers.

62. A semiconductor device, comprising:

a container disposed in an nitride resistive material layer having a surface, the container having sidewalls and a top corner;

a nitride receptive material layer disposed over the sidewalls of the container;

an implant comprising a surface-modifying agent extending downwardly into the nitride resistive material layer relative to the surface and about a circumference from the top corner of the container such that a dielectric layer disposed over the nitride resistive material layer and the nitride receptive material layer has a substantially uniform thickness over both of said layers.

63. A semiconductor device, comprising:

a container disposed in a nitride resistive material layer having a surface, the container having sidewalls and atop corner; and a conductive layer disposed over the sidewalls of the container;

the nitride resistive material layer at the top corner of the container comprising an implant of a surface-modifying agent extending from the surface into the nitride resistive material layer such that a dielectric layer formed over the nitride resistive material layer and the conductive layer has a substantially uniform thickness over both of said layers.

64. A semiconductor device, comprising:

a container disposed in a nitride resistive material layer having a surface, the container having sidewalls and a top corner; and a semiconductive layer disposed over the sidewalls of the container;

the nitride resistive material layer at the top corner of the container comprising an implant of a surface-modifying agent extending from the surface into the nitride resistive material layer such that a dielectric layer formed over the nitride resistive material layer and the semiconductive layer has a substantially uniform thickness over both of said layers.

65. A semiconductor device, comprising:

a container disposed in a nitride resistive material layer having a surface, the container having sidewall and a top corner, the nitride resistive material layer at the top corner of the container comprising an implant of a surface-modifying agent extending from the surface into the nitride resistive material layer; and a nitride receptive material layer disposed over the sidewalls of the container;

said implant effective to modify the surface of the nitride resistive material layer such that a dielectric layer formed over the nitride resistive material layer and the nitride receptive material layer has a substantially uniform thickness over both of said layers.

66. A semiconductor device, comprising:

a container disposed in a nitride resistive material layer having a surface, the container having sidewalls and a top corner; the nitride resistive material layer at the top corner of the container comprising an implant of a surface-modifying agent extending from the surface into the nitride resistive material layer; and a conductive layer disposed over the sidewalls of the container;

said implant effective to modify the surface of the nitride resistive material layer such that a dielectric layer formed over the nitride resistive material layer and the conductive layer has a substantially uniform thickness over both of said layers.

67. A semiconductor device, comprising:

a container disposed in a nitride resistive material layer having a surface, the container having sidewalls and a top corner; the nitride resistive material layer at the top corner of the container comprising an implant of a surface-modifying agent extending from the surface into the nitride resistive material layer; and a semiconductive layer disposed over the sidewalls of the container;

said implant effective to modify the surface of the nitride resistive material layer such that a dielectric layer formed over the nitride resistive material layer and the semiconductive layer has a substantially uniform thickness over both of said layers.

68. A semiconductor device, comprising:

a container disposed in a nitride resistive material layer having a surface, the container having sidewalls and a top corner; the nitride resistive material layer at the top corner of the container comprising an implant of a surface-modifying agent extending from the surface into the nitride resistive material layer;

a nitride receptive material layer disposed over the sidewalls of the container; and a dielectric layer disposed over the nitride resistive material layer and the nitride receptive material layer having a substantially uniform thickness over both of said layers.

69. A semiconductor device, comprising:

a container disposed in a nitride resistive material layer having a surface, the container having sidewalls and atop corner; the nitride resistive material layer at the top corner of the container comprising an implant of a surface-modifying agent extending from the surface into the nitride resistive material layer;

a conductive layer disposed over the sidewalls of the container; and a dielectric layer disposed over the conductive layer and the nitride resistive material layer having a substantially uniform thickness over both of said layers.

70. A semiconductor device, comprising:

a container disposed in a nitride resistive material layer having a surface, the container having sidewalls and a top corner; the nitride resistive material layer at the top corner of the container comprising an implant of a surface-modifying agent extending from the surface into the nitride resistive material layer;

a semiconductive layer disposed over the sidewalls of the container; and a dielectric layer disposed over the semiconductive layer and the nitride resistive material layer having a substantially uniform thickness over both of said layers.

71. A semiconductor device, comprising:

a container disposed in a nitride resistive material layer having a surface, the container having sidewalls and atop corner; and a conductive layer disposed over the sidewalls of the container;

the nitride resistive material layer at the top corner of the container comprising ionized atoms of a nitrogen gas extending from the surface into the nitride resistive material layer to modify the surface of the nitride resistive material layer such that a dielectric layer formed over the nitride resistive material layer and the conductive layer has a substantially uniform thickness over both of said layers.

72. A semiconductor device, comprising:

a container disposed in a nitride resistive material layer having a surface, the container having sidewalls and a top corner; and a conductive layer disposed over the sidewalls of the container;

the nitride resistive material layer at the top corner of the container comprising ionized atoms of a silicon gas extending from the surface into the nitride resistive material layer to modify the surface of the nitride resistive material layer such that a dielectric layer formed over the nitride resistive material layer and the conductive layer has a substantially uniform thickness over both of said layers.

73. A semiconductor device, comprising:

a container disposed in a nitride resistive material layer having a surface, the container having sidewalls and a top corner; and a nitride receptive malarial layer disposed over the sidewalls of the container;

the nitride resistive material layer at the top corner of the container comprising atoms of a nitrogen gas extending from the surface into the nitride resistive material layer to modify the surface of the nitride resistive material layer such that a dielectric layer formed over the nitride receptive material layer and the nitride resistive material layer has a substantially uniform thickness over both of said layers.

74. A semiconductor device, comprising:

a container disposed in a nitride resistive material layer having a surface, the container having sidewalls and a top corner; and a semiconductive layer disposed over the sidewalls of the container;

the nitride resistive material layer at the top corner of the container comprising atoms of a nitrogen gas extending from the surface into the nitride resistive material layer to modify the surface of the nitride resistive material layer such that a dielectric layer formed over the nitride resistive material layer and the semiconductive layer has a substantially uniform thickness over both of said layers.

75. A semiconductor device, comprising:

a container disposed in a nitride resistive material layer having a surface, the container having sidewalls and a top corner; and a conductive layer disposed over the sidewalls of the container;

the nitride resistive material layer at the top corner of the container comprising atoms of a nitrogen gas extending from the surface into the nitride resistive material layer to modify the surface of the nitride resistive material layer such that a dielectric layer formed over the nitride resistive material layer and the conductive layer has a substantially uniform thickness over both of said layers.

* * * * *

UNITED STATES PATENT AND TRADEMARK OFFICE
CERTIFICATE OF CORRECTION

PATENT NO. : 6,831,319 B2
DATED : December 14, 2004
INVENTOR(S) : Zheng

It is certified that error appears in the above-identified patent and that said Letters Patent is hereby corrected as shown below:

Column 11,
Line 63, replace "composing" with -- comprising --.

Column 13,
Line 22, replace "iii" with -- in --.

Column 14,
Line 16, replace "end" with -- and --.

Column 16,
Line 23, replace "atop" with -- a top --.
Line 49, replace "sidewall" with -- sidewalls --.

Column 17,
Lines 39 and 65, replace "atop" with -- a top --.

Signed and Sealed this

Second Day of August, 2005

JON W. DUDAS
*Director of the United States Patent and Trademark Office*